United States Patent
Park

(10) Patent No.: US 12,249,516 B2
(45) Date of Patent: Mar. 11, 2025

(54) MANUFACTURING METHOD OF MEMORY DEVICE USING MASK PATTERNS

(71) Applicant: SK hynix Inc., Icheon-si (KR)

(72) Inventor: Kyung Min Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 538 days.

(21) Appl. No.: 17/538,366

(22) Filed: Nov. 30, 2021

(65) Prior Publication Data

US 2023/0005754 A1 Jan. 5, 2023

(30) Foreign Application Priority Data

Jul. 2, 2021 (KR) .......... 10-2021-0087387

(51) Int. Cl.
*H01L 21/311* (2006.01)
*H01L 21/768* (2006.01)

(52) U.S. Cl.
CPC .. *H01L 21/31144* (2013.01); *H01L 21/31116* (2013.01); *H01L 21/76805* (2013.01); *H01L 21/7684* (2013.01); *H01L 21/76895* (2013.01)

(58) Field of Classification Search
CPC ......... H01L 21/31144; H01L 21/31116; H01L 21/76805; H01L 21/7684; H01L 21/76895; H01L 21/0332; H01L 21/76802; H01L 21/02115; H01L 21/0337; H01L 21/76877; H01L 21/823475; H10B 43/27; H10B 43/50; H10B 41/50; H10B 51/50; H10B 53/50; H10B 61/00; H10B 63/00; H10B 69/00
See application file for complete search history.

(56) References Cited

U.S. PATENT DOCUMENTS

| | | | |
|---|---|---|---|
| 2004/0266201 A1* | 12/2004 | Wille | H01L 21/31144 257/E21.579 |
| 2008/0128753 A1* | 6/2008 | Parikh | H01L 29/66462 257/E29.253 |
| 2009/0115003 A1* | 5/2009 | Sung | H01L 21/28247 257/E21.177 |
| 2016/0099155 A1* | 4/2016 | Park | H01L 21/762 427/249.1 |
| 2017/0365487 A1* | 12/2017 | Shen | H01L 21/30604 |
| 2020/0294773 A1* | 9/2020 | Hishinuma | H01L 21/31144 |
| 2021/0125836 A1* | 4/2021 | Huang | H01L 21/76802 |
| 2021/0184109 A1* | 6/2021 | Zhou | H10N 50/10 |
| 2021/0294215 A1* | 9/2021 | Dai | G03F 7/094 |

FOREIGN PATENT DOCUMENTS

| | | |
|---|---|---|
| KR | 100780596 B1 | 11/2007 |
| KR | 102107308 B1 | 5/2020 |

* cited by examiner

*Primary Examiner* — Karen Kusumakar
*Assistant Examiner* — Shawn Shaw Muslim
(74) *Attorney, Agent, or Firm* — WILLIAM PARK & ASSOCIATES LTD.

(57) ABSTRACT

There is a method of manufacturing a memory device. The method includes forming a mask layer on an etching target layer; forming, on the mask layer, a compensation layer with a second impurity that chemically bonds to the mask layer with a first impurity; performing a first etching process that patterns the compensation layer and the mask layer to form a mask pattern; and performing a second etching process that etches the etching target layer, which is exposed through openings of the mask pattern.

19 Claims, 19 Drawing Sheets

MANUFACTURING METHOD OF MEMORY DEVICE USING MASK PATTERNS

CROSS-REFERENCE TO RELATED APPLICATION

The present application claims priority under 35 U.S.C. § 119(a) to Korean patent application number 10-2021-0087387, filed on Jul. 2, 2021, in the Korean Intellectual Property Office, the entire disclosure of which is incorporated herein by reference.

BACKGROUND

1. Technical Field

The present disclosure generally relates to a mask pattern, and more particularly, to a manufacturing method of a memory device including mask patterns for forming trenches or contact holes with a narrow distance between patterns.

2. Related Art

A memory device may be configured to store data and erase or output stored data. For example, the memory device may include a memory block storing data and peripheral circuits configured to program data in the memory block, or erase or output programmed data.

The memory block and the peripheral circuits include a plurality of transistors and a plurality of lines. The sizes and distances of the plurality of transistors and the plurality of lines gradually decrease as the degree of integration of the memory device gradually increases. Therefore, in a manufacturing process of the memory device, a defect such as a bridge may occur between adjacent elements.

SUMMARY

In accordance with an aspect of the present disclosure, there is provided a method of manufacturing a memory device, the method including: forming a mask layer on an etching target layer; forming, on the mask layer, a compensation layer with a second impurity that chemically bonds to the mask layer with a first impurity; performing a first etching process that patterns the compensation layer and the mask layer to form a mask pattern; and performing a second etching process that etches the etching target layer, which is exposed through openings of the mask pattern.

In accordance with another aspect of the present disclosure, there is provided a method of manufacturing a memory device, the method including: alternately forming, on an etching target layer, a plurality of mask layers and a plurality of compensation layers, the plurality of compensation layers being chemically bonded to the plurality of mask layers; performing a first etching process to form a mask pattern with openings that expose portions of the etching target layer, the first etching process including patterning the plurality of mask layers and the plurality of compensation layers; and performing a second etching process to form contact holes in the etching target layer by removing the portions of the etching target layer that are exposed through the openings.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a manufacturing method of a memory device, which can prevent occurrence of a bridge between adjacent elements.

Figure 1A:
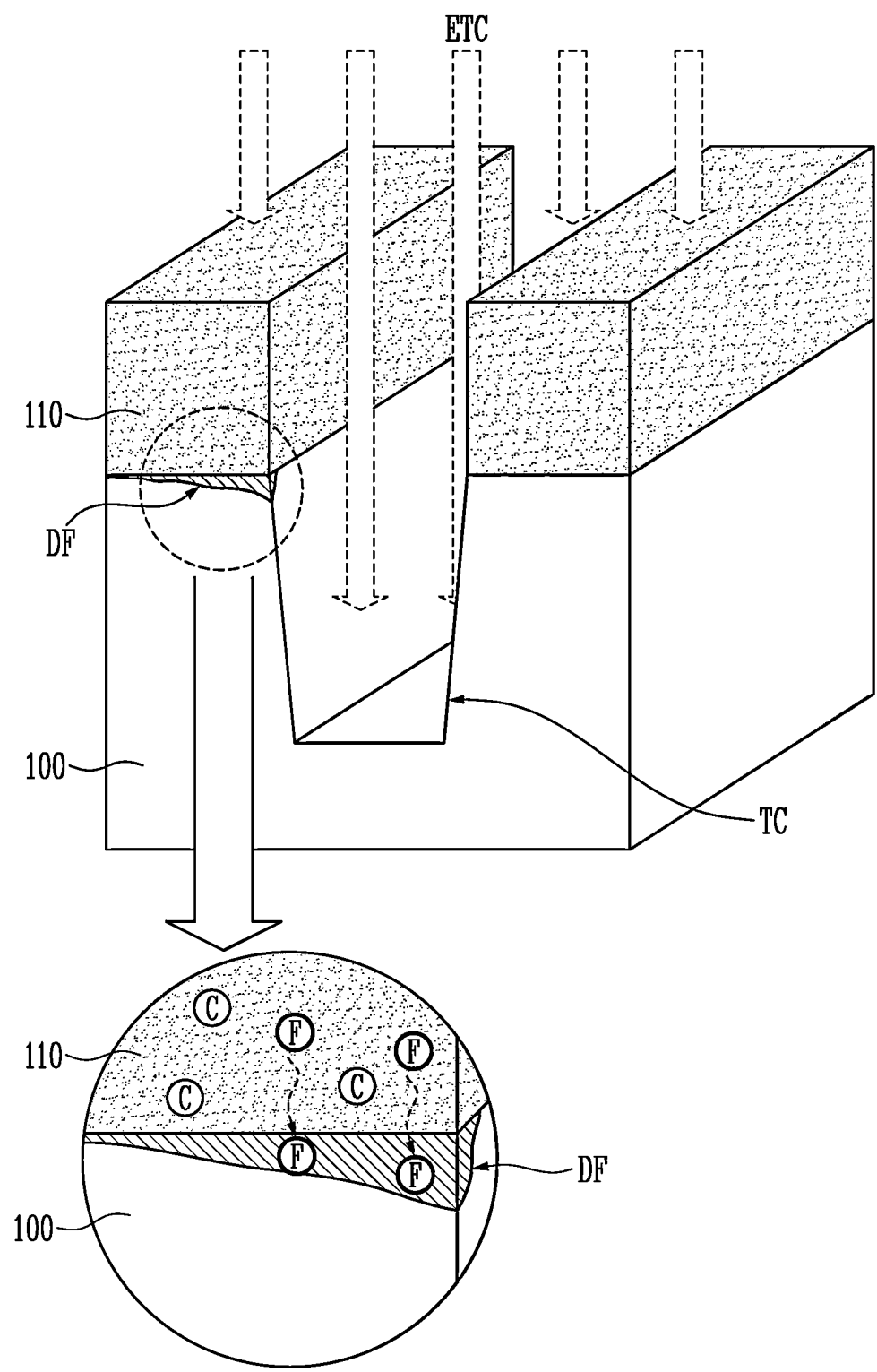
FIGS. 1A to 1C are views illustrating a defect which may occur in a manufacturing process of a memory device.
Figure 1B:
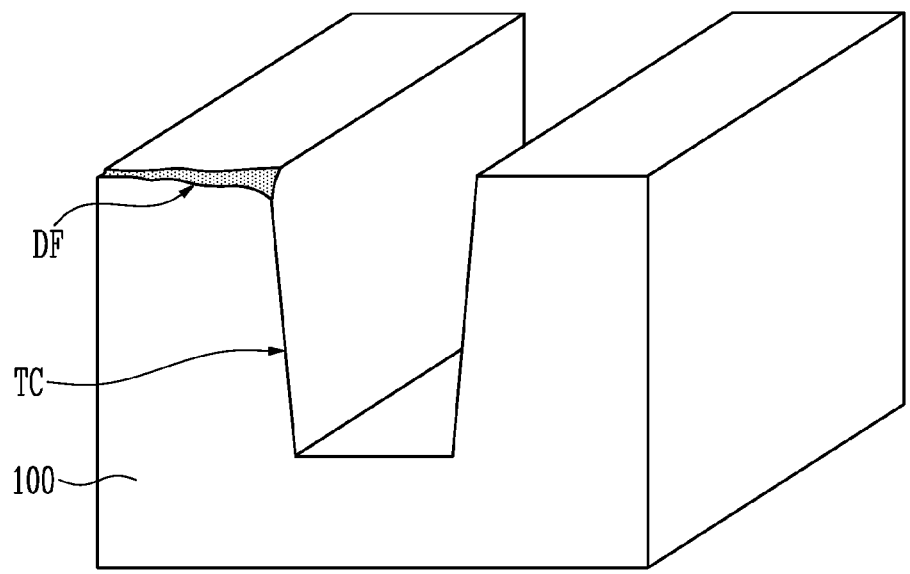
Figure 1C:
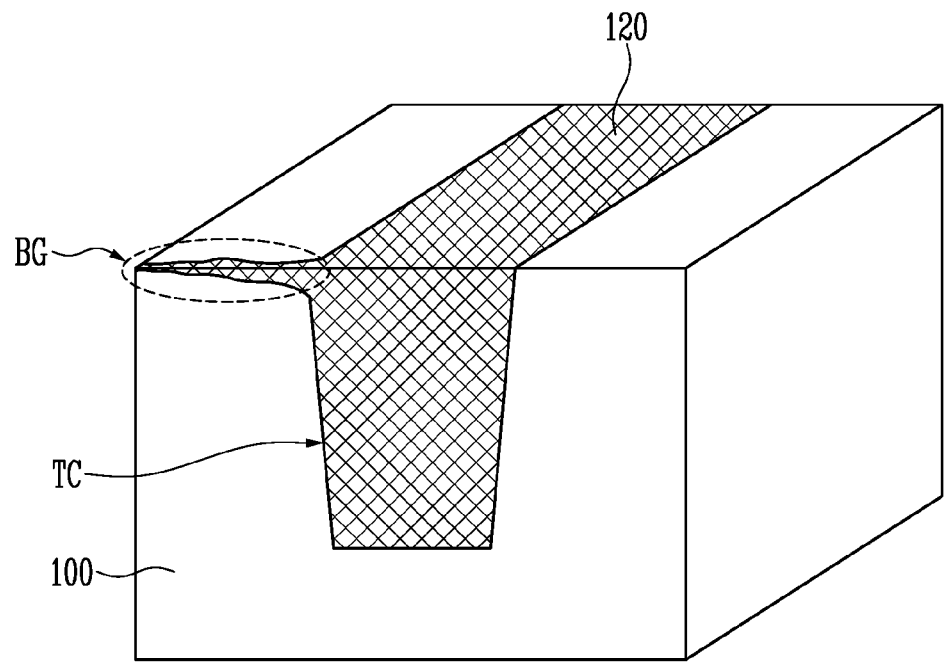

FIGS. 1A to 1C are views illustrating a defect which may occur in a manufacturing process of a memory device.

Referring to FIG. 1A, a mask pattern 110 may be formed on the top of an etching target layer 100. Although not shown in the drawing, a lower structure, such as a substrate or a peripheral circuit, may be formed below the etching target layer 100. The etching target layer 100 may be an interlayer insulating layer. For example, the etching target layer 100 may be formed of silicon oxide. In order to form a trench TC or a contact hole in the etching target layer 100, the mask pattern 110 in which an opening is formed in an etching target region may be formed on the top of the etching target layer 100. The mask pattern 110 may be formed of carbon. For example, the mask pattern 110 may be formed of amorphous carbon. The mask pattern 110 may include openings that expose portions of the etching target layer 100. Although the mask pattern 110 in which an opening with a line shape is formed has been illustrated in FIG. 1A, the opening may be implemented in various shapes, such as a circular shape and a polygonal shape.

When an etching process that uses the mask pattern 110 as an etching mask is performed, the trench TC may be formed as the etching target layer 100 that is exposed through the openings of the mask pattern 110 is etched. The etching process may be performed through a dry etching process by using plasma. The etching process may be performed by using, as an etching gas ETC, a gas with a high etching selectivity with respect to the etching target layer 100. For example, when the etching target layer 100 that is formed of silicon oxide is etched by using the mask pattern 110 that contains carbon as an etching mask, the etching process may be performed by using the etching gas ETC that contains fluorine. For example, $CF_4$ or $CHF_3$ gas may be used as the etching gas ETC.

When the etching process, using the etching gas ETC that contains fluorine, is performed, the fluorine that is contained in the etching gas ETC may be ionized by plasma, and fluorine (F) ions may be introduced into the etching target layer 100 through the mask pattern 110. Since the fluorine has a high etching selectivity with respect to the etching target layer 100, a defect DF that is caused by the fluorine may occur outside of a region in which the trench TC is formed. For example, when a defect DF occurs in a region in which etching of the etching target layer 100 is inhibited, a portion of the etching target layer 100 may be etched due to the defect DF.

Referring to FIG. 1B, the defect DF that occurs in the etching target layer 100 may occur in the etching process that uses the etching gas ETC and may remain after the mask pattern 110 is removed. A region in which the defect DF occurs may be further removed even in a cleaning process performed after the etching process is performed.

Referring to FIG. 1C, when the trench TC is filled with a conductive layer 120 in a state in which a defect DF occurs in the etching target layer 100, the conductive layer 120 may spill into a region in which the defect DF occurs. Therefore, although a polishing process that allows the conductive layer 120 to remain only in the trench TC is performed, the conductive layer 120, which spills into the region in which the defect DF occurs, may remain and hence a bridge BG may be formed. For example, a bridge BG may be formed between a line that is formed in the trench TC and adjacent lines to be electrically blocked from the line. When the bridge BG is formed between the lines to be electrically blocked from each other, a malfunction may occur in an operation of the memory device, and therefore, the reliability of the memory device may deteriorate.

FIGS. 2A to 2D are views illustrating a method of forming a mask in accordance with an embodiment of the present disclosure.

Figure 2A:
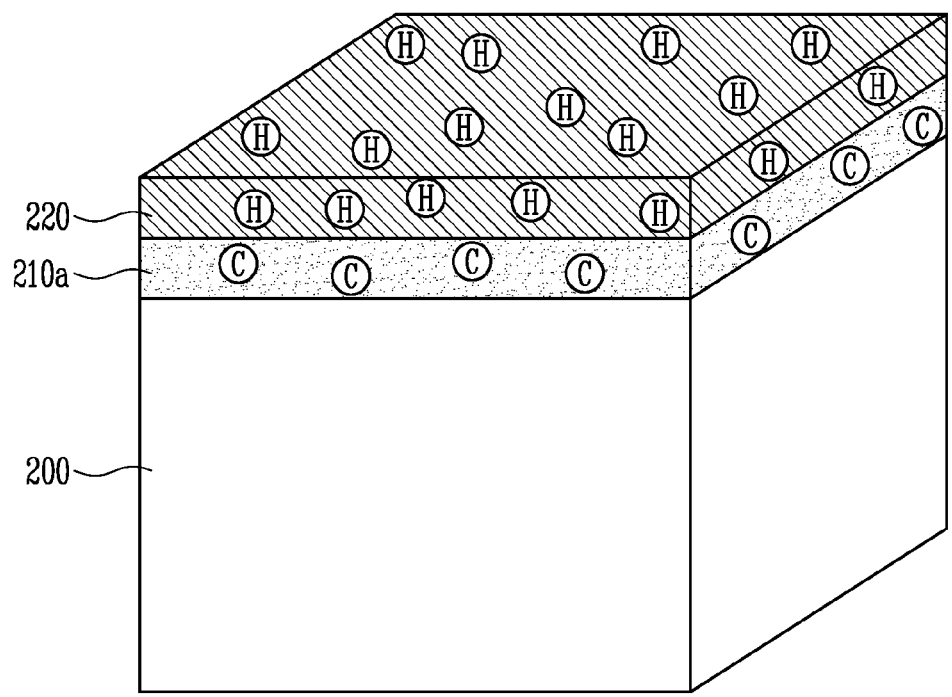
FIGS. 2A to 2D are views illustrating a method of forming a mask in accordance with an embodiment of the present disclosure.

Referring to FIG. 2A, a first mask layer 210a and a compensation layer 220 may be formed on the top of an etching target layer 200. Although not shown in the drawing, a lower structure such as a substrate or a peripheral circuit may be formed on the bottom of the etching target layer 200.

The etching target layer 200 may be formed of an insulating material. For example, the etching target layer 200 may be formed of oxide or silicon oxide. The first mask layer 210a may be formed on the top of the etching target layer 200, and the compensation layer 220 may be formed on the top of the first mask layer 210a. The first mask layer 210a may be used as a mask pattern in an etching process of the etching target layer 200 and may be formed of carbon. For example, the first mask layer 210a may be formed of amorphous carbon.

The compensation layer 220 may be formed to prevent a defect that occurs in the etching target layer 200 during the etching process. For example, the compensation layer 220 may be formed to prevent a bridge from forming, which may occur in the etching target layer 200 due to the first mask layer 210a. To this end, the compensation layer 220 may be formed of a material that is easily chemically bonded to the first mask layer 210a. When the first mask layer 210a is formed of a material that contains carbon (C), the compensation layer 220 may be formed of a material that includes hydrogen (H), which is easily ion-bonded to carbon (C). For example, the compensation layer 220 may be formed to be a layer with a high density of hydrogen (H).

Figure 2B:
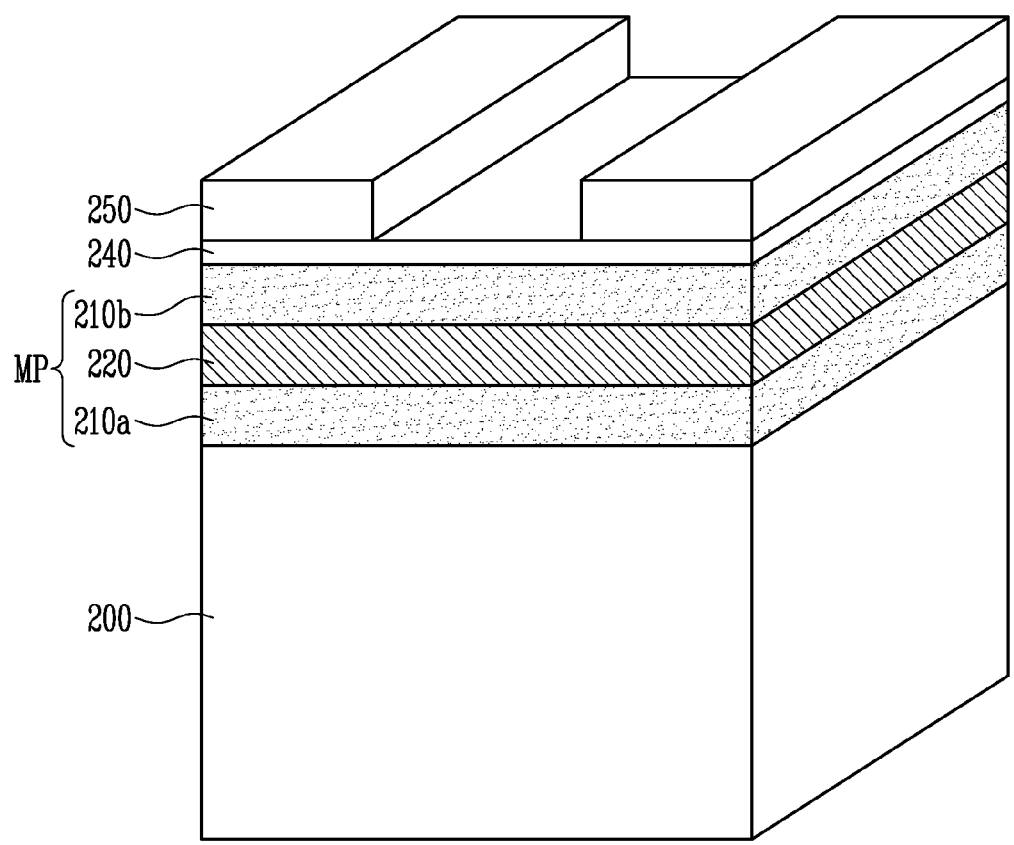

Referring to FIG. 2B, a second mask layer 210b, a barrier layer 240, and a photoresist pattern 250 may be sequentially formed on the top of the compensation layer 220. The barrier layer 240 may be formed of silicon oxide. The second mask layer 210b may be formed on the top of the compensation layer 220, the barrier layer 240 may be formed on the top of the second mask layer 210b, and the photoresist pattern 250 may be formed on the top of the barrier layer 240. The first mask layer 210a, the compensation layer 220, and the second mask layer 210b may be used as a mask pattern MP.

The photoresist pattern 250 and the barrier layer 240 may be used as a pattern used in a process of patterning the second mask layer 210b, the compensation layer 220, and the first mask layer 210a, and the first mask layer 210a, the compensation layer 220, and the second mask layer 210b may be used as the mask pattern MP used in a process of etching the etching target layer. Therefore, a layers or a pattern, which may be formed on the top of the mask pattern MP, is not limited to the barrier layer 240 and the photoresist pattern 250, and various layers or patterns may be formed.

The first mask layer 210a, the compensation layer 220, and the second mask layer 210b, which are included in the mask pattern MP, may be formed by using an in-situ method of changing a gas in the same chamber or be formed by using an ex-situ method that uses different gases in different chambers.

Figure 2C:
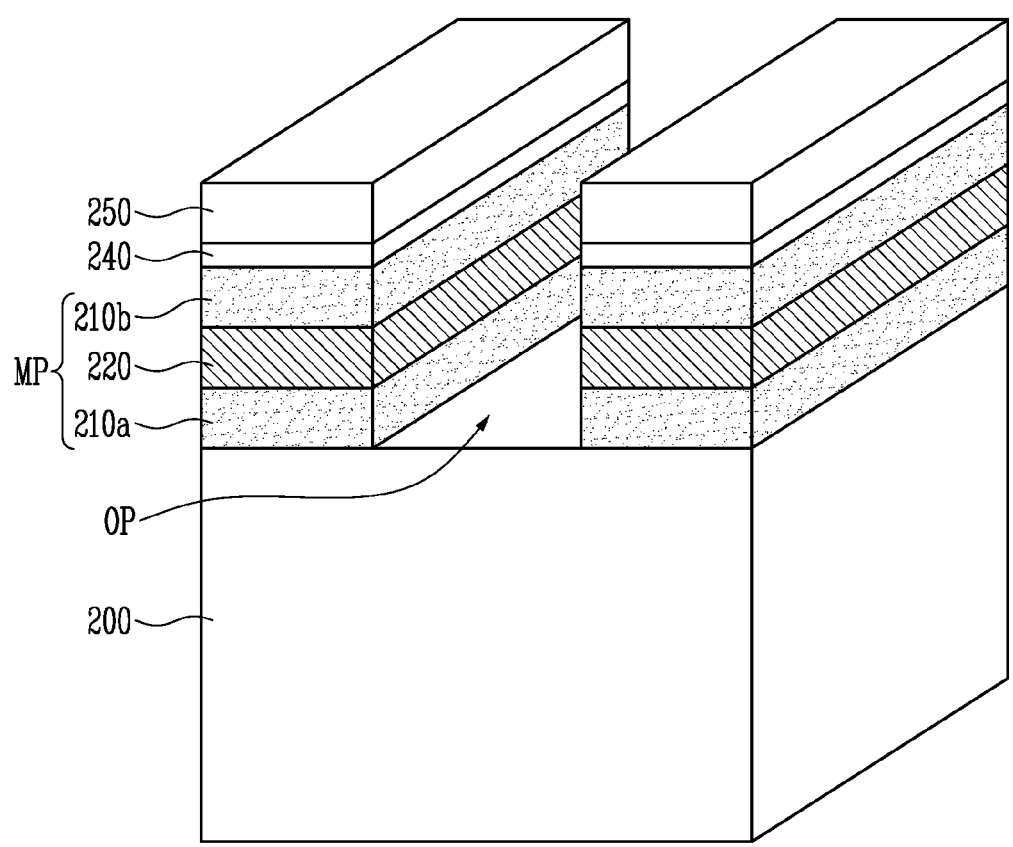

Referring to FIG. 2C, the barrier layer 240, the second mask layer 210b, the compensation layer 220, and the first mask layer 210a, which are exposed through an opening of the photoresist pattern 250, are sequentially etched through an etching process, and therefore, openings OP that expose portions of the etching target layer 200 may be formed.

Figure 2D:
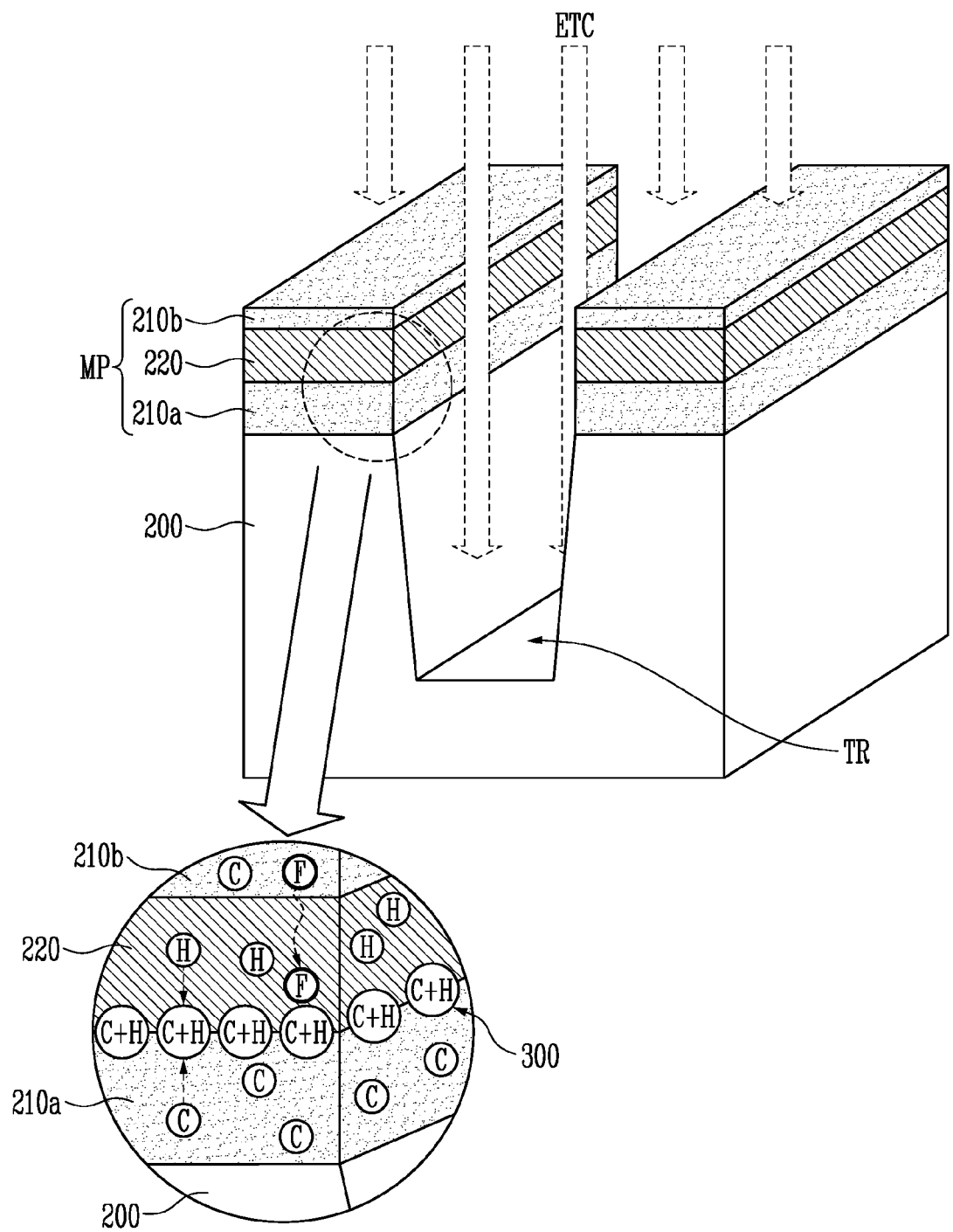

Referring to FIG. 2D, an etching process for etching a portion of the etching target layer 200 exposed through the opening of the mask pattern MP may be performed. The etching process may be performed through a dry etching process by using plasma.

The etching process may be performed by using an etching gas ETC with an etching selectivity with respect to the etching target layer 200, which is higher than that of the mask pattern MP. For example, the etching process may be performed by using, as the etching gas ETC, a fluorine gas or a gas that contains fluorine. For example, $CF_4$ or $CHF_3$ gas may be used as the etching gas ETC.

Both the photoresist pattern (250 shown in FIG. 2C) and the barrier layer (240 shown in FIG. 2C), which are formed on the top of the mask pattern MP, may be removed while the etching process is performed. Therefore, a top surface of the mask pattern MP may be exposed by the etching process that uses the etching gas ETC. Although an etching speed of the etching target layer 200 is faster than that of the mask pattern MP, the mask pattern MP may also be etched little by little while the etching process is performed.

When the etching process is performed, the fluorine that is contained in the etching gas ETC may be ionized into fluorine (F) ions due to the plasma, and the fluorine (F) ions may infiltrate into the second mask layer 210b included in the mask pattern MP.

In this embodiment, since the compensation layer 220 is located between the first and second mask layers 210a and 210b, chemical bonding of impurities may occur between the compensation layer 220 and the first and second mask layers 210a and 210b. For example, covalent bonding in which a hydrogen (H) atom and a carbon (C) atom share an electron pair with each other may occur between the compensation layer 220 and the first and second mask layers 210a and 210b, and ionic bonding in which fluorine (F) ions and hydrogen (H) ions are bonded to each other may occur between the compensation layer 220 and the first and second mask layers 210a and 210b. Due to the covalent bonding of hydrogen (H) and carbon (C), a compensation crystal structure 300 may be formed in a boundary region between the compensation layer 220 and the first and second mask layers 210a and 210b or in a first mask layer 210a. The compensation crystal structure 300 is a crystal structure formed due to the covalent bonding of hydrogen (H) and carbon (C), and may function to increase densities of the compensation layer 220 and the first mask layer 210a. Thus, although fluorine ions F infiltrate into the mask pattern MP in the etching process, the infiltration can be suppressed by the compensation crystal structure 300. Accordingly, the number of fluorine ions F infiltrating into the first mask layer 210a can be decreased, and a defect which may occur in the etching target layer 200 due to the etching gas ETC can be reduced.

Also, in order to further suppress the infiltration of the fluorine ions F, the first and second mask layers 210a and 210b may be formed at a temperature higher than a normal temperature. When assuming that the normal temperature at which the first and second mask layers 210a and 210b are formed is a reference temperature, the densities of the first and second mask layers 210a and 210b may be increased when the first and second mask layers 210a and 210b are formed under the condition of a temperature higher than the reference temperature. When the densities of the first and second mask layers 210a and 210b are increased, the number and infiltration speed of the fluorine ions F can be further decreased, and thus the probability that a defect will occur in an etching process for forming a trench TR can be lowered.

Figure 3:
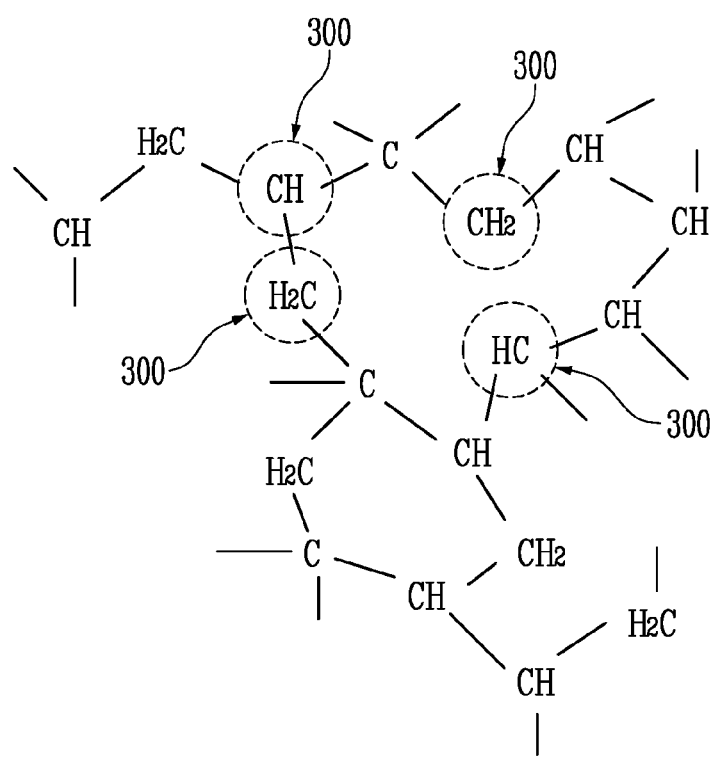
FIG. 3 is a view illustrating a structural formula in which ions of a mask and a compensation layer are bonded to each other.

FIG. 3 is a view illustrating a structural formula in which ions of a mask and a compensation layer are bonded to each other.

Referring to FIGS. 3 and 2D, carbon (C) ions of the first mask layer 210a and hydrogen (H) ions of the compensation layer 220 may be bonded to each other in various structures. For example, the compensation crystal structure 300 of carbon (C) and hydrogen (H) may be generated as a structure of at least one of $CH$, $CH_2$, $HC$, and $H_2C$.

Figure 4:
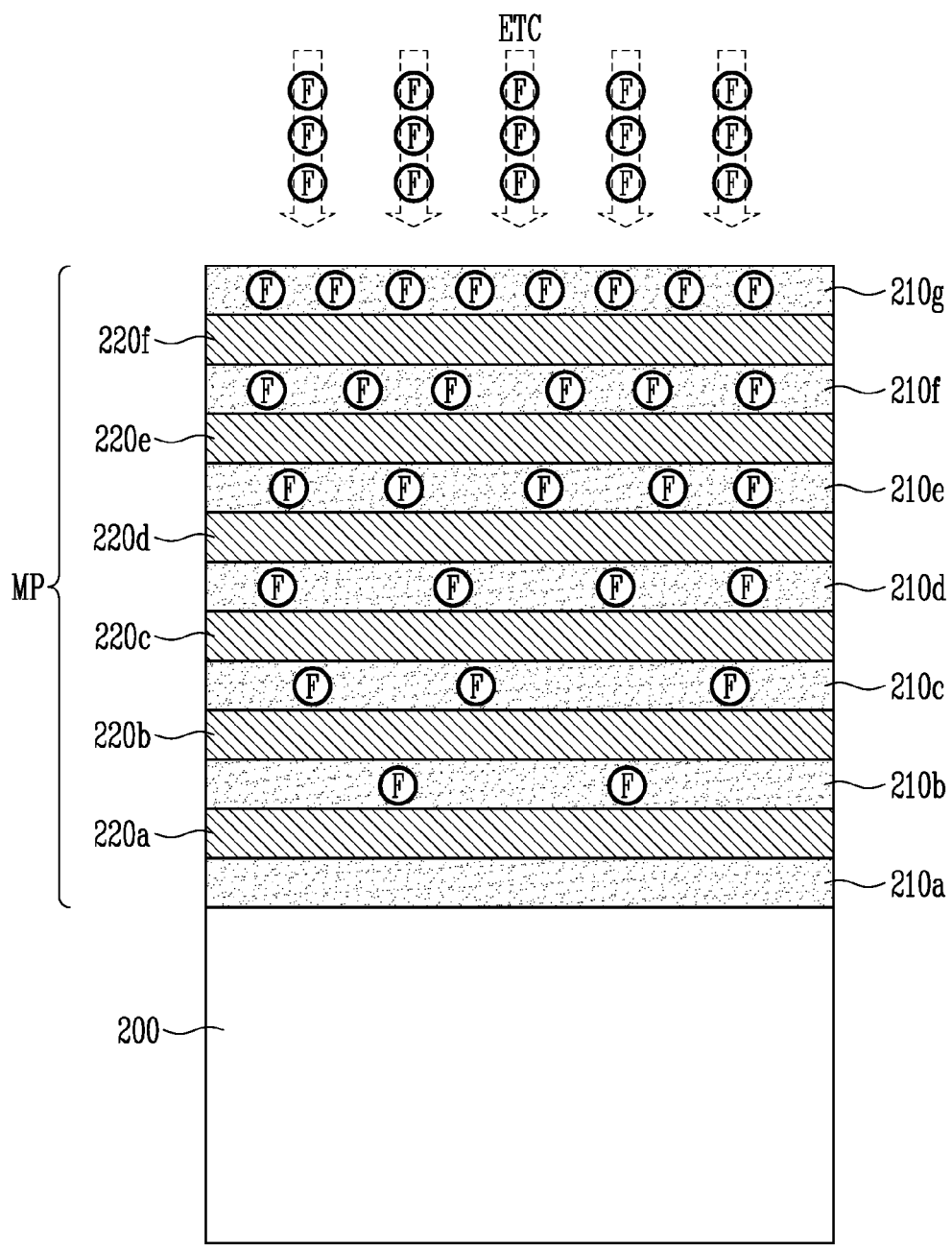
FIG. 4 is a view illustrating a method of forming a mask in accordance with another embodiment of the present disclosure.

FIG. 4 is a view illustrating a method of forming a mask in accordance with another embodiment of the present disclosure.

Referring to FIG. 4, a plurality of mask layers 210a to 210g and a plurality of compensation layers 220a to 220f may be alternately stacked on the top of an etching target layer 200. For example, after a first mask layer 210a is formed on the top of the etching target layer 200, a first compensation layer 220a may be formed on the top of the first mask layer 210a. A second mask layer 210b may be formed on the top of the first compensation layer 220a, and a second compensation layer 220b may be formed on the top of the second mask layer 210b. In this manner, the plurality of compensation layers 220a to 220f may be alternately disposed between the plurality of mask layers 210a to 210g. The number of first to seventh mask layers 210a to 210g and first to sixth compensation layers 220a to 220f, which are alternately stacked, is not limited to what is shown in the drawing.

When the plurality of mask layers 210a to 210g and the plurality of compensation layers 220a to 220f are included in a mask pattern MP, the number of fluorine ions F that infiltrate downwardly can be decreased by the compensation crystal structure (300 shown in FIG. 3), even when the fluorine ions F infiltrate downwardly while piercing the compensation crystal structure 300 from the top of the mask pattern MP. Accordingly, a phenomenon can be prevented, the phenomenon being a defect that occurs as the fluorine ions F infiltrate even into the etching target layer 200.

The above-described embodiment may be used in various etching processes for forming trenches or contact holes, which are adjacent to each other, during a manufacturing process of the memory device. In an example, a manufacturing process of forming contact plugs in a memory cell array will be described as follows.

FIGS. 5A to 5F are views illustrating a manufacturing method of a memory device in accordance with an embodiment of the present disclosure.

Figure 5A:
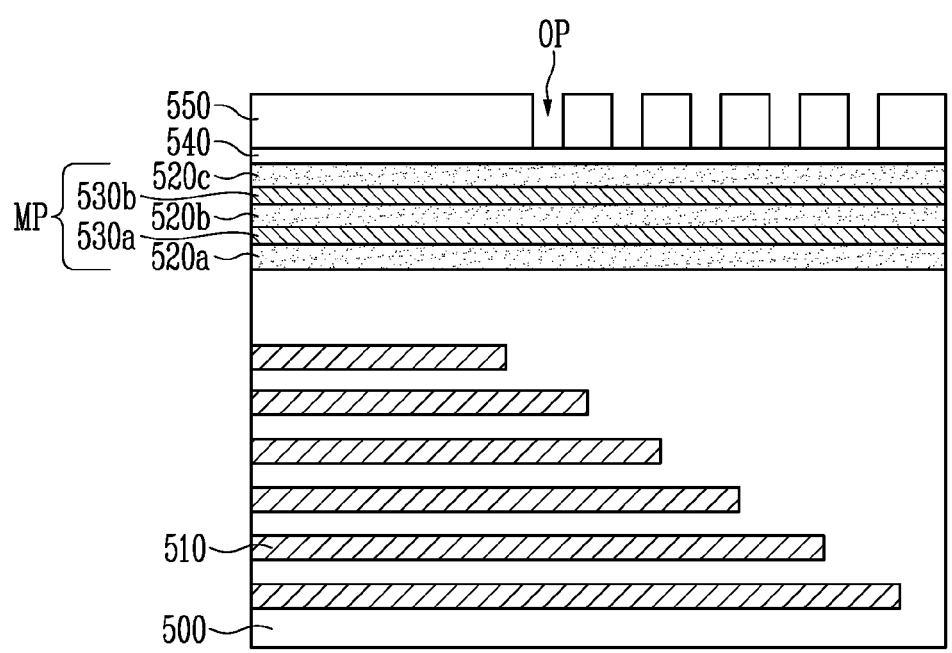
FIGS. 5A to 5F are views illustrating a manufacturing method of a memory device in accordance with an embodiment of the present disclosure.

Referring to FIG. 5A, first to third mask layers 520a to 520c and first and second compensation layers 530a and 530b, which are used as a mask pattern MP, may be alternately stacked on the top of a first interlayer insulating layer 500. A barrier layer 540 and a photoresist pattern 550 may be sequentially stacked on the top of the mask pattern MP. Although not shown in the drawing, a lower structure, such as a substrate or a peripheral circuit, may be formed below the first insulating layer 500 as an etching target layer.

The first interlayer insulating layer 500 may be formed of silicon oxide. A plurality of gate lines 510 that are used as word lines may be formed in the first interlayer insulating layer 500. The gate lines 510 may be stacked to be spaced apart from each other in a vertical direction from the substrate and may be formed in a stepped shape. The gate lines 510 may be formed of a conductive material and may be formed of, for example, tungsten.

The first to third mask layers 520a to 520c may be formed of carbon. For example, the first to third mask layers 520a to 520c may be formed of amorphous carbon.

The first and second compensation layers 530a and 530b that prevent the formation of a bridge in the first interlayer insulating layer 500 in a subsequent etching process may be formed between the first to third mask layers 520a to 520c. The first and second compensation layers 530a and 530b may be formed of a material that contains hydrogen (H) that is easily chemically bonded to carbon (C) that is contained in the first to third mask layers 520a to 520c. For example, the first and second compensation layers 530a and 530b may be a hard mask layer with a high density of the hydrogen (H).

The photoresist pattern 550 and the barrier layer 540 may be used as an etching mask pattern in a process of patterning the first to third mask layers 520a to 520c and the first and second compensation layers 530a and 530b. The barrier layer 540 may be formed of silicon oxide. The photoresist pattern 550 may include openings OP that expose portions of the barrier layer 540.

Figure 5B:
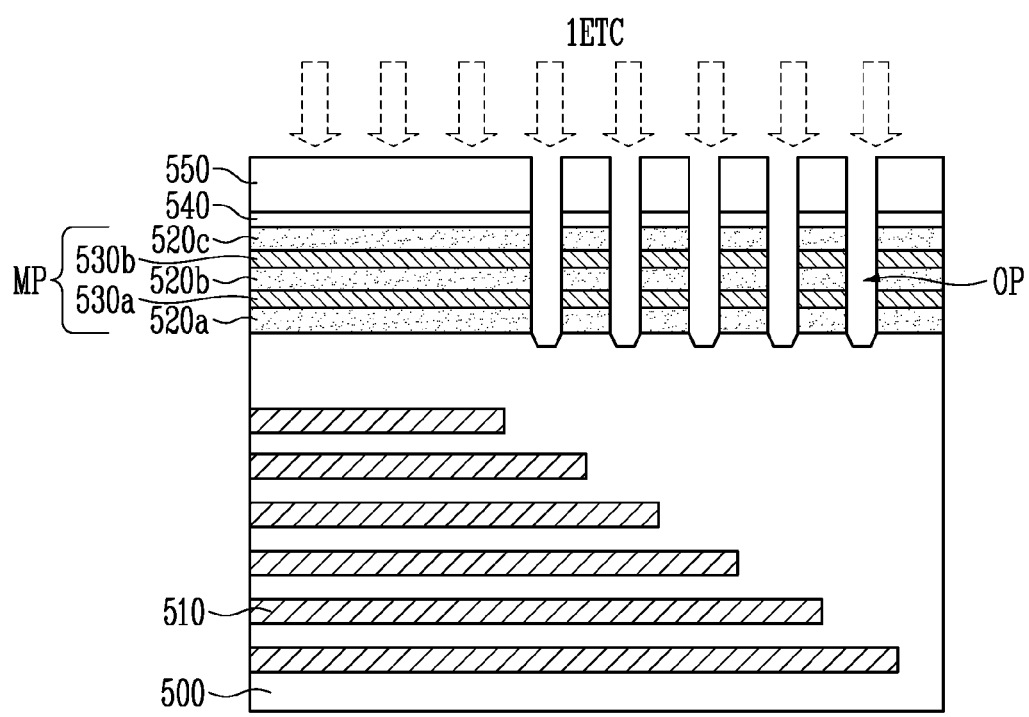

Referring to FIG. 5B, a first etching process for forming openings OP in the barrier layer 540, the first to third mask layers 520a to 520c, and the first and second compensation layers 530a and 530b may be performed. The first etching process may be a dry etching process and may be performed by using a first etching gas 1ETC. For example, the first etching gas 1ETC may include a gas with an etching selectivity with respect to the barrier layer 540, the first to third mask layers 520a to 520c, and the first and second compensation layers 530a and 530b, which is higher than that of the photoresist pattern 550. The first etching process may be performed until the first interlayer insulating layer 500 is exposed through the openings OP of the mask pattern MP.

Figure 5C:
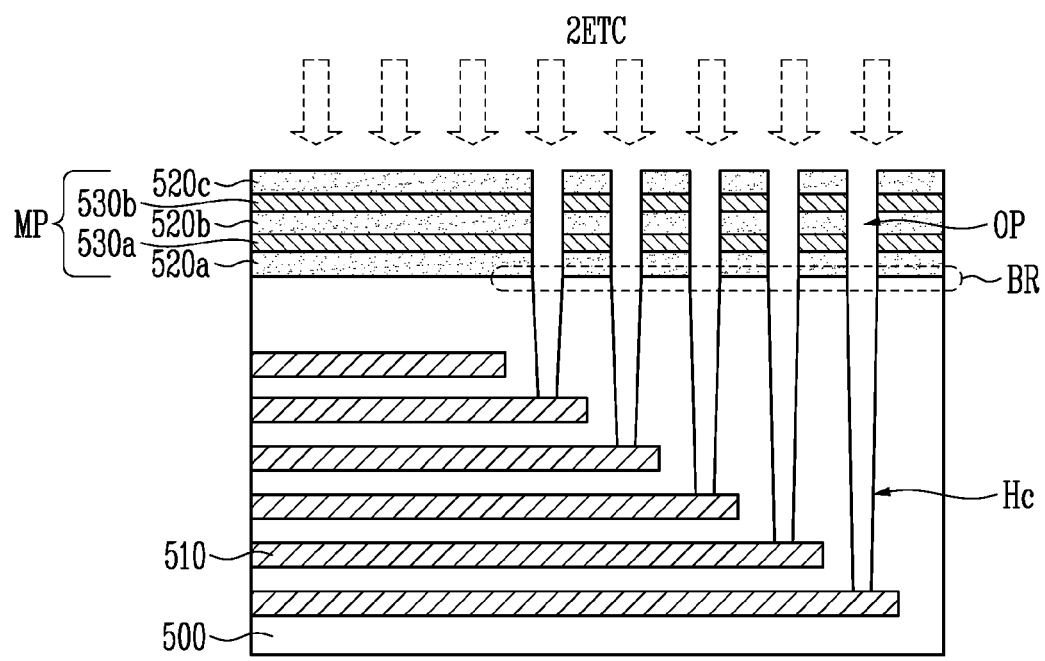

Referring to FIG. 5C, when the first interlayer insulating layer 500 is exposed through the openings OP of the mask pattern MP, a second etching process for forming contact holes Hc in the first interlayer insulating layer 500 that are exposed through the openings OP may be performed. The second etching process may be performed through a dry etching process. For example, the second etching process may be performed by using a second etching gas 2ETC with an etching selectivity with respect to the first interlayer insulating layer 500, which is higher than that of the mask pattern MP. The second etching gas 2ETC may include a gas that contains fluorine. For example, $CF_4$ or $CHF_3$ gas may be used as the second etching gas 2ETC.

Since plasma is used in the dry etching process, fluorine ions that are ionized by the plasma in the second etching gas 2ETC may be introduced into the mask pattern MP. Atoms of the first to third mask layers 520a to 520c and the first and second compensation layers 530a and 530b, which are included in the mask pattern MP, may be chemically bonded to each other, thereby generating a compensation crystal structure. The fluorine ions might not infiltrate into the first interlayer insulating layer 500 due to the compensation crystal structure. Thus, a defect that is caused by the fluorine ions in a boundary region BR in which the first interlayer insulating layer 500 and the first mask layer 520a are in contact with each other can be prevented. The second etching process may be performed until the gate lines 510 are exposed through the contact holes Hc.

Figure 5D:
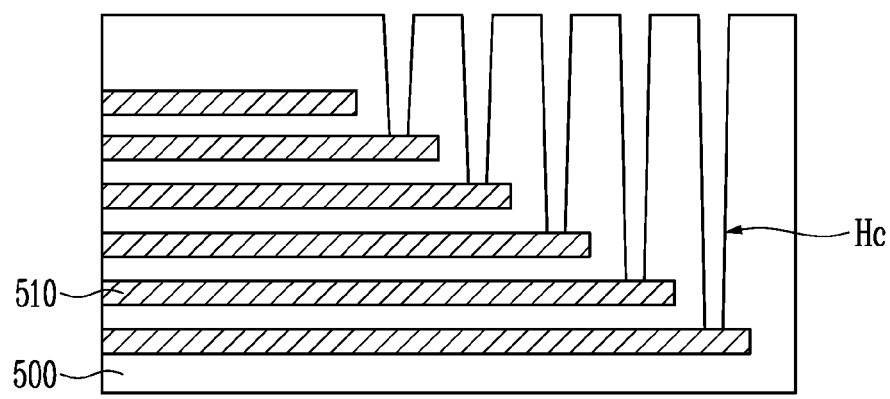

Referring to FIG. 5D, a cleaning process for removing the mask pattern (MP shown in FIG. 5C) may be performed. The cleaning process may be performed as a wet etching process and may be performed by using an etchant with an etching selectivity with respect to the mask pattern MP, which is higher than those of the first interlayer insulating layer 500 and the gate lines 510.

Figure 5E:
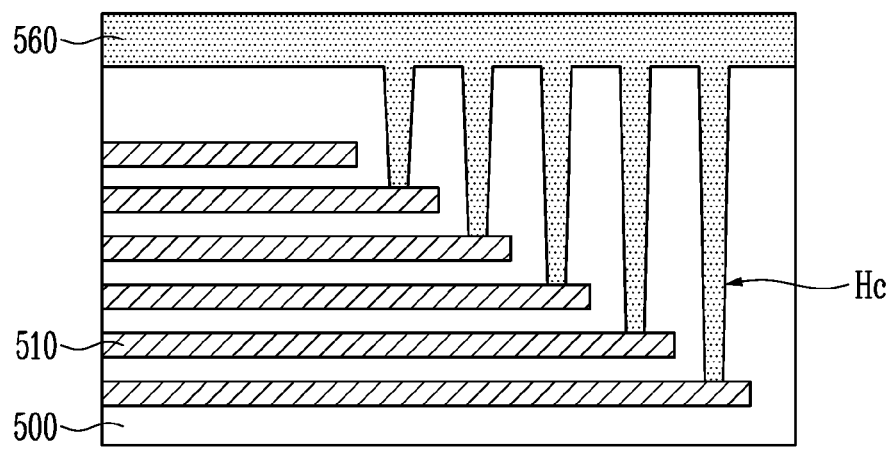

Referring to FIG. 5E, a conductive layer 560 may be formed on the entire structure to fill the contact holes Hc. The conductive layer 560 may be formed of poly-silicon or tungsten. In order to completely fill the contact holes Hc, the conductive layer 560 may be formed such that the top of the first interlayer insulating layer 500 is entirely covered by the conductive layer 560.

Figure 5F:
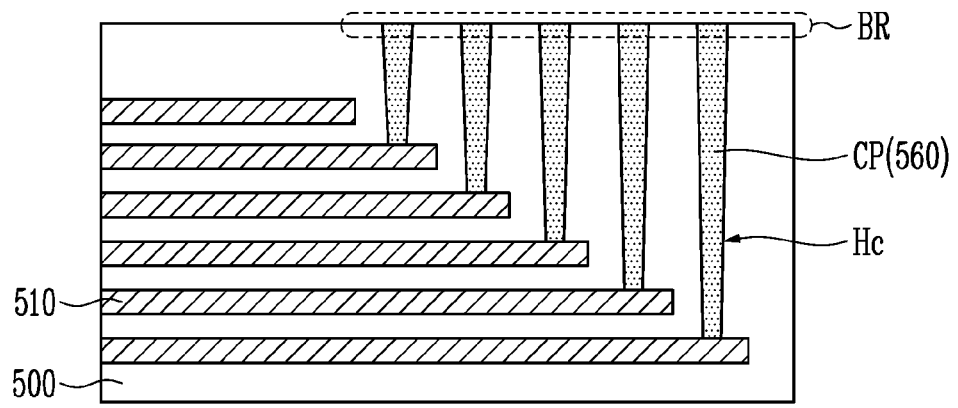

Referring to FIG. 5F, a polishing process may be performed to allow the conductive layers 560 that fill the contact holes Hc to be electrically isolated from each other. The polishing process may be a chemical mechanical polishing process and may be performed until the top of the first interlayer insulating layer 500 is exposed. Since a bridge is not formed in the first interlayer insulating layer 500, exposed in the boundary region BR, contact plugs CP that are formed in different contact holes Hc may be electrically isolated from each other.

In the drawings described with reference to FIGS. 5A to 5F, the manufacturing method of the contact plugs CP that are formed in a memory cell array has been illustrated as an embodiment. However, a manufacturing method of a hard mask that uses a compensation layer may be applied in manufacturing processes of forming trenches or channels, which are adjacent to each other, in addition to the contact plugs CP.

FIGS. 6A to 6F are views illustrating a manufacturing method of a memory device in accordance with another embodiment of the present disclosure.

Figure 6A:
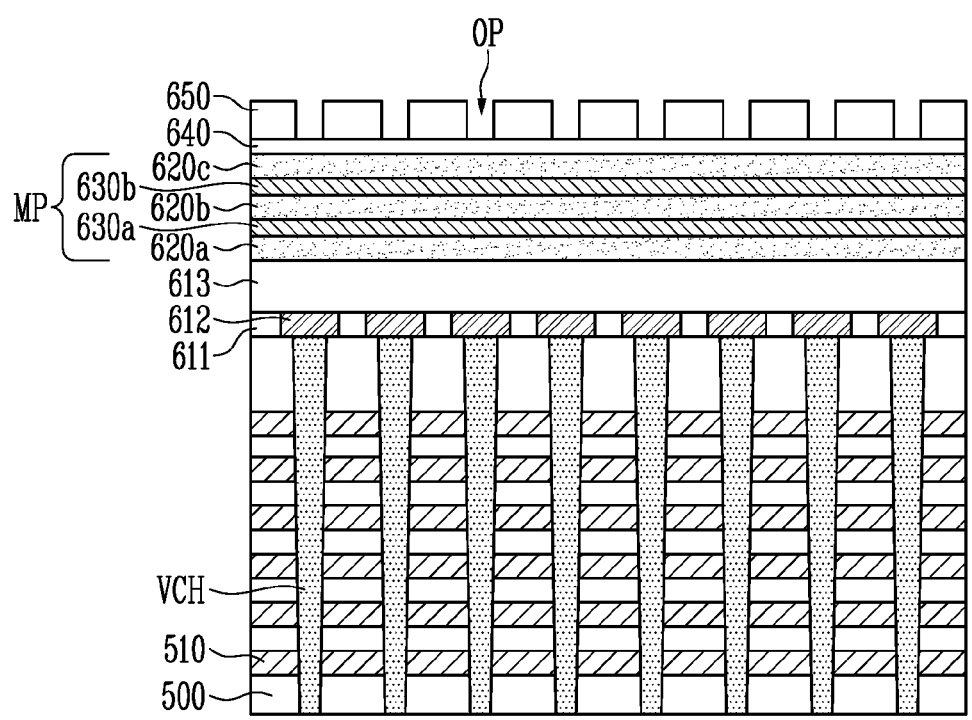
FIGS. 6A to 6F are views illustrating a manufacturing method of a memory device in accordance with another embodiment of the present disclosure.

Referring to FIG. 6A, vertical channel layers VCH may be formed in a stack structure in which a first interlayer insulating layer 500 and gate lines 510 are alternately stacked. The gate lines 510 may be formed of a conductive material. For example, the gate lines 510 may be formed of, for example, tungsten. Although not shown in the drawing, a lower structure, such as a substrate or a peripheral circuit, may be formed below the vertical channel layers VCH. The vertical channel layers VCH may include memory layers, constituting a memory cell. A second interlayer insulating layer 611 and bit lines 612 may be formed on the entire structure that includes the vertical channel layers VCH. The second interlayer insulating layer 611 may be formed of oxide or silicon oxide, and the bit lines 612 may be formed of a conductive material. The bit lines 612 may be formed on the top of the vertical channel layers VCH. A third interlayer insulating layer 613 may be formed on the top of the second interlayer insulating layer 611 and the bit lines 612. The third interlayer insulating layer 613 may be formed of silicon oxide.

First to third mask layers 620a to 620c and first and second compensation layers 630a and 630b, which are used as a mask pattern MP, may be alternately stacked on the top of the third interlayer insulating layer 613. A barrier layer 640 and a photoresist pattern 650 may be sequentially stacked on the top of the mask pattern MR The mask pattern MP may be formed of the same material as the mask pattern MP shown in FIG. 5A. For example, the first to third mask layers 620a to 620c may be formed of amorphous carbon.

The first and second compensation layers 630a and 630b that prevent the formation of a bridge in the third interlayer insulating layer 613 in a subsequent etching process may be formed between the first to third mask layers 620a to 620c. The first and second compensation layers 630a and 630b may be formed of a material that contains hydrogen (H) that is easily chemically boded to carbon (C) that is contained in the first to third mask layers 620a to 620c. For example, the first and second compensation layers 630a and 630b may be a hard mask layer with a high density of the hydrogen (H).

The photoresist pattern 650 and the barrier layer 640 may be used as an etching mask pattern in a process of patterning the first to third mask layers 620a to 620c and the first and second compensation layers 630a and 630b. The barrier layer 640 may be formed of a silicon oxide. The photoresist pattern 650 may include openings OP that expose portions of the barrier layer 640.

Figure 6B:
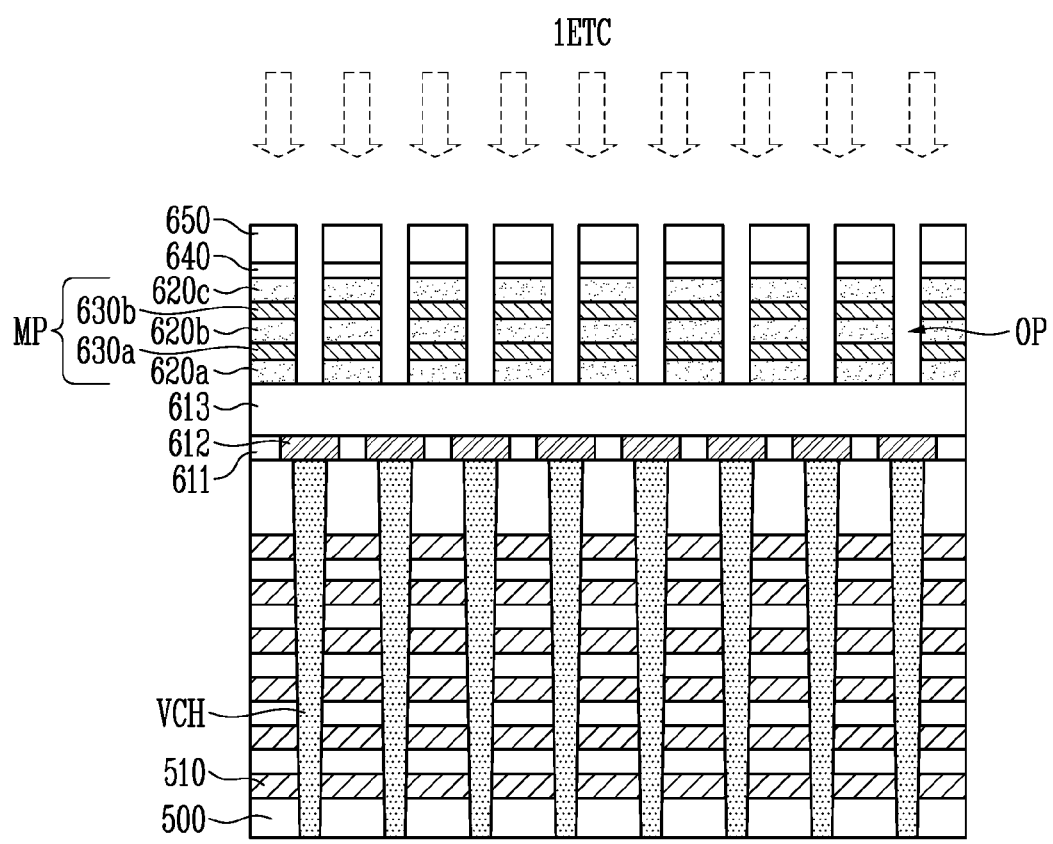

Referring to FIG. 6B, a first etching process for forming openings OP in the barrier layer 640, the first to third mask layers 620a to 620c, and the first and second compensation layers 630a and 630b may be performed. The first etching process may be a dry etching process, and may be performed by using a first etching gas 1ETC. For example, the first etching gas 1ETC may include a gas with an etching selectivity with respect to in the barrier layer 640, the first to third mask layers 620a to 620c, and the first and second compensation layers 630a and 630b, which is higher than that of the photoresist pattern 650. The first etching process may be performed until the third interlayer insulating layer 613 is exposed through the openings OP of the mask pattern MP.

Figure 6C:
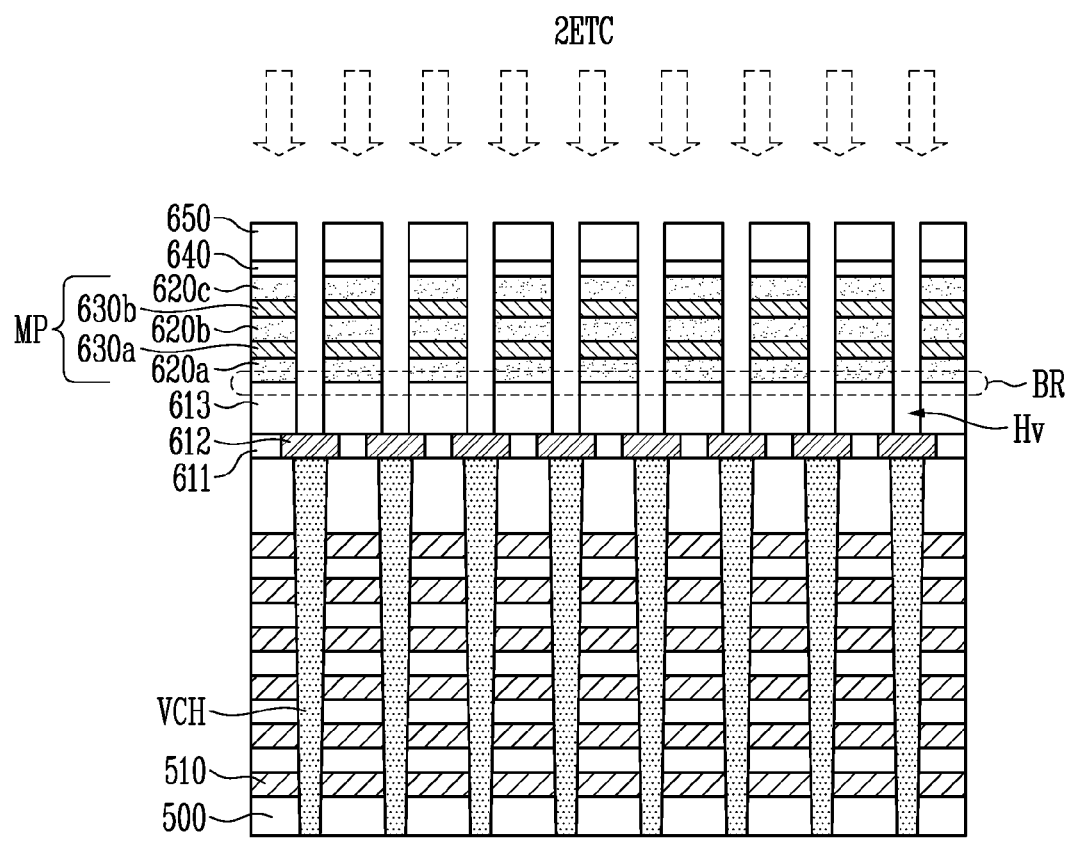

Referring to FIG. 6C, when the third interlayer insulating layer 613 is exposed through the openings OP of the mask pattern MP, a second etching process for forming via holes Hv in the third interlayer insulating layer 613 that is exposed through the openings OP may be performed. The second etching process may be performed through a dry etching process. For example, the second etching process may be performed by using a second etching gas 2ETC with an etching selectivity with respect to the third interlayer insulating layer 613, which is higher than that of the mask pattern MP. The second etching gas 2ETC may include a gas that contains fluorine. For example, $CF_4$ or $CHF_3$ gas may be used as the second etching gas 2ETC.

Since plasma is used in the dry etching process, fluorine ions that are ionized by the plasma in the second etching gas 2ETC may be introduced into the mask pattern MR Atoms of the first to third mask layers 620a to 620c and the first and second compensation layers 630a and 630b, which are included in the mask pattern MP, may be chemically bonded to each other, thereby generating a compensation crystal structure. The fluorine ions might not infiltrate into the third interlayer insulating layer 613 due to the compensation crystal structure. Thus, a defect that is caused by the fluorine ions in a boundary region BR in which the third interlayer insulating layer 613 and the first mask layer 620a are in contact with each other can be prevented. The second etching process may be performed until the bit lines 612 are exposed through the via holes Hv.

Figure 6D:
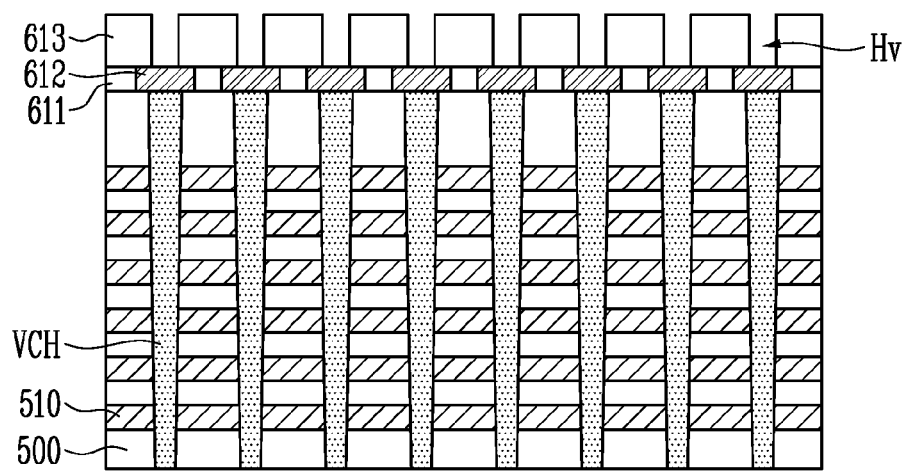

Referring to FIG. 6D, a cleaning process for removing the mask pattern (MP shown in FIG. 6C) may be performed. The cleaning process may be performed as a wet etching process and may be performed by using an etchant with an etching selectivity with respect to the mask pattern MP, which is higher than those of the third interlayer insulating layer 613 and the bit lines 612.

Figure 6E:
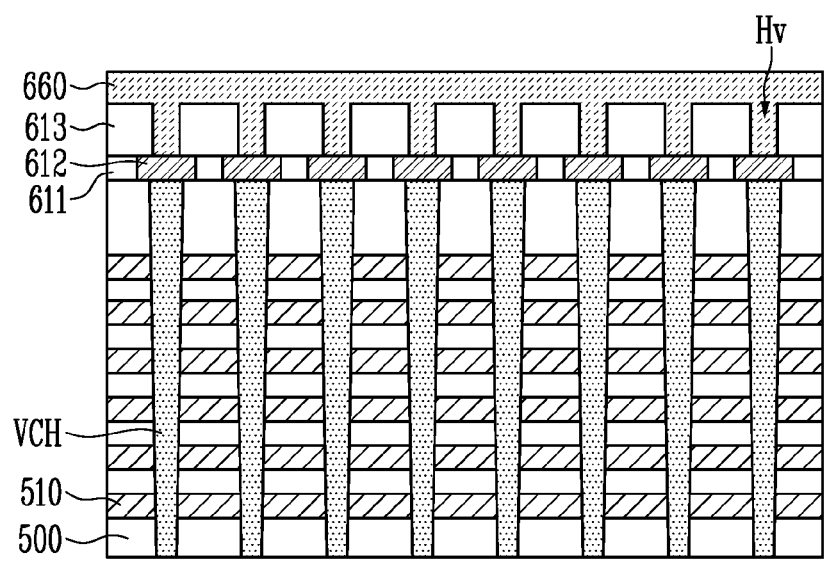

Referring to FIG. 6E, a conductive layer 660 may be formed on the entire structure to fill the via holes Hv. The conductive layer 660 may be formed of poly-silicon or tungsten. In order to completely fill the via holes Hv, the conductive layer 660 may be formed such that the top of the third interlayer insulating layer 613 is entirely covered by the conductive layer 660.

Figure 6F:
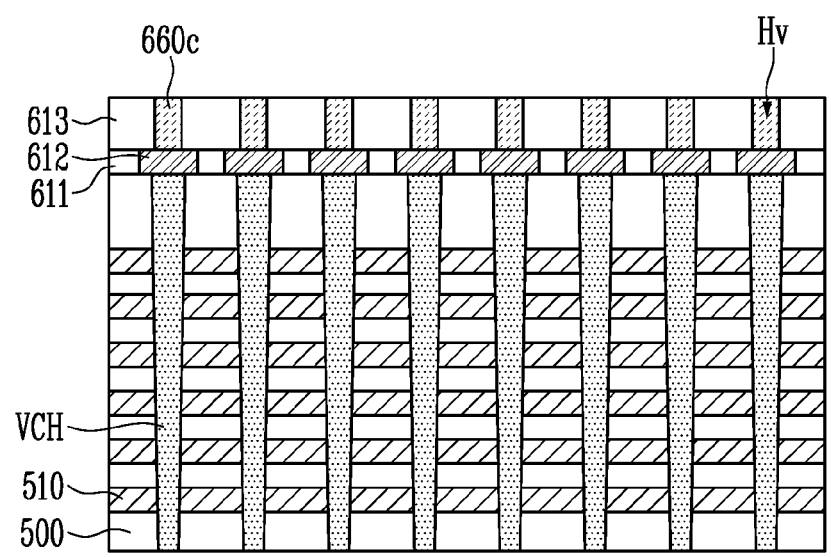

Referring to FIG. 6F, a polishing process may be performed to allow the conductive layers 660 that fill the via holes Hv to be electrically isolated from each other. The polishing process may be a chemical mechanical polishing process and may be performed until the top of the third interlayer insulating layer 613 is exposed. Since a bridge is not formed in the third interlayer insulating layer 613, exposed in the boundary region BR, contact plugs 660c that are formed in different via holes Hv may be electrically isolated from each other.

Figure 7:
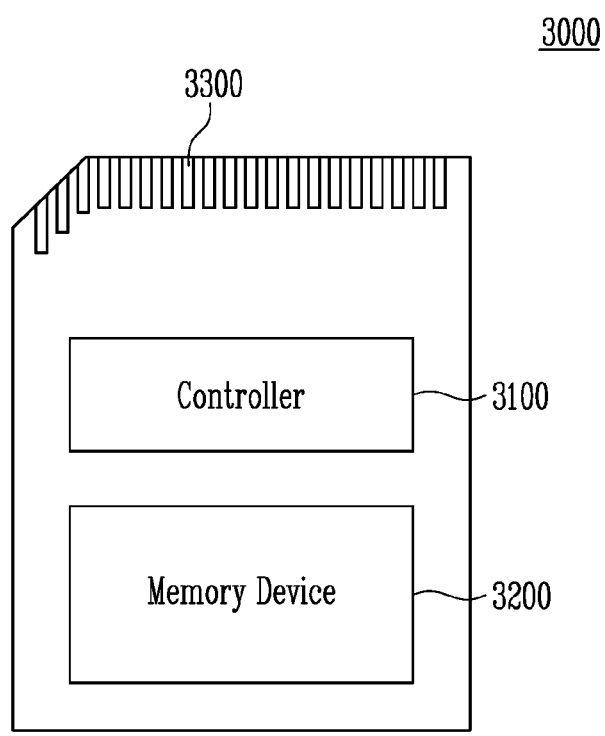
FIG. 7 is a block diagram illustrating a memory card system to which the manufactured memory device is applied in accordance with an embodiment of the present disclosure.

FIG. 7 is a block diagram illustrating a memory card system to which the manufactured memory device is applied in accordance with an embodiment of the present disclosure.

Referring to FIG. 7, the memory card system 3000 may include a controller 3100, a memory device 3200, and a connector 3300.

The controller 3100 may be connected to the memory device 3200. The controller 3100 may access the memory device 3200. For example, the controller 3100 may control a program, read, or erase operation, or may control a background operation of the memory device 3200. The controller 3100 may provide an interface between the memory device 3200 and a host. The controller 3100 may drive firmware for controlling the memory device 3200. To this end, the controller 3100 may include components, such as a Random Access Memory (RAM), a processing unit, a host interface, a memory interface, and an error corrector.

The controller 3100 may communicate with an external device through the connector 3300. The controller 3100 may communicate with the external device (e.g., the host) according to a specific communication protocol. Exemplarily, the controller 3100 may communicate with the external device through at least one of various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The memory device 3200 may be manufactured in accordance with the above-described embodiment of the present disclosure, and be implemented with various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The controller 3100 and the memory device 3200 may be integrated into a single semiconductor device, to constitute a memory card. For example, the controller 3100 and the memory device 3200 may constitute a memory card, such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 8:
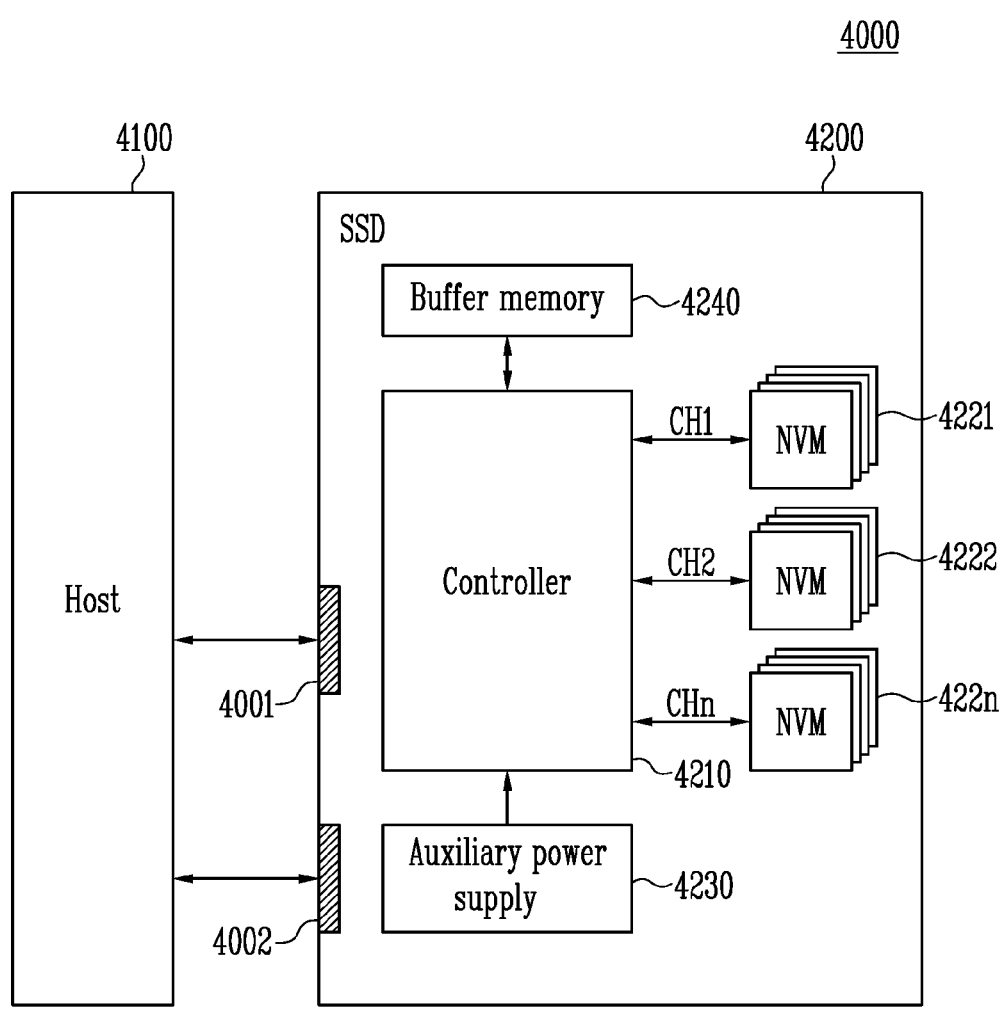
FIG. 8 is a block diagram illustrating a Solid State Drive (SDD) to which the manufactured memory device is applied in accordance with an embodiment of the present disclosure.

FIG. 8 is a block diagram illustrating a Solid State Drive (SDD) to which the manufactured memory device is applied in accordance with an embodiment of the present disclosure.

Referring to FIG. 8, the SSD system 4000 may include a host 4100 and an SSD 4200. The SSD 4200 may exchange a signal SIG with the host 4100 through a signal connector 4001, and receives power PWR through a power connector 4002. The SSD 4200 may include a controller 4210, a plurality of flash memories 4221 to 422n, an auxiliary power supply 4230, and a buffer memory 4240.

The controller 4210 may control the plurality of flash memories 4221 to 422n in response to a signal that is received from the host 4100. Exemplarily, the signal may be a signal based on an interface between the host 4100 and the SSD 4200. For example, the signal may be a signal that is defined by at least one of interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 4230 may be connected to the host 4100 through the power connector 4002. The auxiliary power supply 4230 may receive power PWR that is input from the host 4100 and charge the power PWR. When the supply of power from the host 4100 is not smooth, the auxiliary power supply 4230 may provide power for the SSD 4200. Exemplarily, the auxiliary power supply 4230 may be located in the SSD 4200 or located outside of the SSD 4200. For example, the auxiliary power supply 4230 may be located on a main board and may provide auxiliary power to the SSD 4200.

The buffer memory 4240 may operate as a buffer memory of the SSD 4200. For example, the buffer memory 4240 may temporarily store data that is received from the host 4100 or data that is received from the plurality of flash memories 4221 to 422n, or temporarily store meta data (e.g., a mapping table) of the flash memories 4221 to 422n. The buffer memory 4240 may include volatile memories, such as a DRAM, an SDRAM, a DDR SDRAM, an LPDDR SDRAM, and a GRAM or nonvolatile memories such as a FRAM, a ReRAM, an STT-MRAM, and a PRAM.

The mask pattern, in accordance with the above-described embodiment of the present disclosure, may be used in processes of manufacturing the buffer memory 4240 and the plurality of flash memories 4221 to 422n.

In accordance with the present disclosure, a defect which may occur in a hole or a trench in an etching process that uses a mask pattern can be reduced and prevented. Accordingly, occurrence of a bridge between adjacent elements can be prevented.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a memory device, the method comprising:
    forming a mask layer on an etching target layer;
    forming, on the mask layer, a compensation layer with a second impurity that chemically bonds to the mask layer with a first impurity;
    performing a first etching process that patterns the compensation layer and the mask layer to form a mask pattern; and
    performing a second etching process that etches the etching target layer, which is exposed through openings of the mask pattern,
    wherein the second impurity includes hydrogen.

2. The method of claim 1, wherein the etching target layer is formed of oxide or silicon oxide.

3. The method of claim 1, wherein the first impurity is carbon.

4. The method of claim 1, wherein the mask layer is formed of amorphous carbon.

5. The method of claim 1, wherein the mask layer is formed at a temperature that is higher than a reference temperature at which the mask layer is normally formed.

6. The method of claim 1, wherein the compensation layer is formed to be a layer with the second impurity or is formed to be a layer with a high density of the second impurity.

7. The method of claim 1, wherein the mask layer and the compensation layer are formed by using an in-situ method in a same chamber.

8. The method of claim 1, wherein the mask layer and the compensation layer are formed by using an ex-situ method in different chambers.

9. The method of claim 1, further comprising sequentially forming a barrier layer and a photoresist pattern on the compensation layer before the first etching process is performed.

10. The method of claim 9, wherein the photoresist pattern includes openings that expose portions of the barrier layer, and
    wherein the openings have a circular shape or a polygonal shape.

11. The method of claim 1, wherein the second etching process is performed through a dry etching process by using plasma.

12. The method of claim 1, wherein the second etching process is performed by using an etching gas with an etching selectivity with respect to the etching target layer, which is higher than that of the mask pattern.

13. The method of claim 12, wherein the etching gas includes a fluorine gas or a gas that contains fluorine.

14. The method of claim 12, wherein the etching gas is $CF_4$ or $CHF_3$ gas.

15. A method of manufacturing a memory device, the method comprising:
    alternately forming, on an etching target layer, a plurality of mask layers and a plurality of compensation layers, the plurality of compensation layers being chemically bonded to the plurality of mask layers and including hydrogen;
    performing a first etching process to form a mask pattern with openings that expose portions of the etching target layer, the first etching process including patterning the plurality of mask layers and the plurality of compensation layers; and
    performing a second etching process to form contact holes in the etching target layer by removing the portions of the etching target layer that are exposed through the openings.

16. The method of claim 15, wherein the plurality of mask layers are formed of carbon.

17. The method of claim 15, wherein the plurality of compensation layers are formed with a high density of hydrogen.

18. The method of claim 15, wherein the second etching process is performed by using a fluorine gas or an etching gas that contains fluorine.

19. The method of claim 15, further comprising: after the contact holes are formed,
   removing the mask pattern;
   forming a conductive layer on the entire structure including the contact holes; and
   performing a polishing process to expose the top of the etching target layer.

* * * * *